United States Patent [19]

Miyazaki et al.

[11] Patent Number: 5,677,626
[45] Date of Patent: Oct. 14, 1997

[54] SYSTEM FOR MAGNETIC RESONANCE IMAGING

[75] Inventors: Mitsue Miyazaki; Fumitoshi Kojima, both of Otawara, Japan

[73] Assignee: Kabushiki Kaisha Toshiba, Japan

[21] Appl. No.: 316,896

[22] Filed: Oct. 3, 1994

Related U.S. Application Data

[63] Continuation-in-part of Ser. No. 233,353, Apr. 26, 1994, Pat. No. 5,557,202.

[30] Foreign Application Priority Data

Apr. 15, 1994 [JP] Japan .................................. 6-077435
Aug. 26, 1994 [JP] Japan .................................. 6-202361

[51] Int. Cl.$^6$ ............................................. G01V 3/00
[52] U.S. Cl. ............................................. 324/307; 324/309
[58] Field of Search ............................................. 324/307, 309, 324/306, 300, 312, 314

[56] References Cited

U.S. PATENT DOCUMENTS 5,050,609  9/1991  Balaban et al. .................. 128/653.2
5,111,143  5/1992  McKinnon et al. .................. 324/309
5,121,059  6/1992  Wieland .................. 324/307
5,420,510  5/1995  Fairbanks et al. .................. 324/309

*Primary Examiner*—Louis M. Arana
*Attorney, Agent, or Firm*—Limbach & Limbach LLP; Ronald L. Yin

[57] ABSTRACT

A system for magnetic resonance imaging is provided in which a prepulse is first applied to an object being examined placed in a static magnetic field for suppressing an MR signal from fat of the object. Then a pulse sequence including an RF pulse for multi-slice imaging of a plurality of slicing planes is applied to the object for acquiring image data. The system comprises an element for performing a shimming increasing uniformity of the static magnetic field, an element for detecting, every one of the slicing planes, an offset value offsetting a frequency shift of a spectrum distribution caused by turbulence in higher-order components of the static magnetic field, and an element for correcting, every one of the slicing planes, a frequency range of the prepulse in accordance with the offset value detected. The correcting element corrects a frequency of the RF pulse in compliance with the detected offset value.

16 Claims, 18 Drawing Sheets

SYSTEM FOR MAGNETIC RESONANCE IMAGING

This is a continuation-in-part application of application Ser. No. 08/233,353, filed on Apr. 26, 1994 now U.S. Pat. No. 5,557,202.

BACKGROUND OF THE INVENTION

The present invention relates to a system for magnetic resonance imaging (MRI) and, more particularly, to the system in which a suppression effect of magnetic resonance (MR) signals from fat within an object being diagnosed is improved by using a pulse sequence including a procedure of applying a prepulse before scan for imaging.

In the MR image acquisition, there is a case in which obtaining a so-called MTC (Magnetization Transfer Contrast) is significant from a clinical point of view.

FIG. 1 illustrates the spectrum of protons contained in water, fat and macromolecule. As can be seen in FIG. 1, protons contained in water have a resonance frequency of about 64 MHz under a magnetic field of, for example, 1.5 tesla. However, the resonance frequency of protons contained in fat, as is well known, shifts toward the low frequency side (the right side in the figure) by 3.5 PPM by chemical shift, and under the above-mentioned magnetic field shifts by about 224 Hz. Meanwhile, protons contained in macromolecule have characteristics such that their frequency width is extremely wide.

If a frequency offset by, for example, 500 Hz from the resonance frequency of protons of water is selectively excited before an ordinary imaging sequence is performed, the level of MR signals from the protons of macromolecule decreases as indicated by the broken line. Further, the level of the MR signals from the protons contained in water decreases as indicated by the broken line. This is thought to be due to the fact that the protons of water are cross relaxed or exchanged with the protons of macromolecule, which fact is already known as an MTC (Magnetization Transfer Contrast) effect.

Use of such an MTC effect makes it possible to obtain an image having a contrast different from that of the prior art in proportion to the ratio at which the macromolecule is present. Also, since the level of signals of the parenchyma portion can be advantageously reduced much more than the level of signals of the blood vessel portions, the MTC effect is applied to angiography in which fine blood vessels are extracted.

FIG. 2 illustrates an example of a pulse for selectively irradiating protons of macromolecule. The pulse shown in this figure is what is commonly called a binomial pulse formed of a plurality of pulse groups such that the pulse length is set at a ratio represented by a binomial distribution and its polarity is alternately reversed. Particularly, the binomial pulse shown therein is such that the pulse length is set at 1:2:1 (hereinafter such a binomial pulse will be abbreviated as a 121 pulse), and the time τ between two pulses is short, thus the total time being set at approximately 1 msec by taking the above-mentioned frequency into consideration.

FIG. 3 is a curve representing the magnetization characteristics of the 121 pulse. The vertical axis depicts magnetization Mz, and the horizontal axis depicts the amount of shift from the center frequency $f_0$. This curve shows the following: protons having a spectrum value near the center frequency are not excited, thus no influences are left in an imaging sequence performed after the binomial pulse is applied. However, protons having a spectrum value which is apart from the center frequency by 500 Hz or more are excited by the binomial pulse, no magnetization is left, and the level of MR signals obtained in a later imaging sequence is reduced. That is, the range of frequencies at which signals can be extracted in a later imaging sequence corresponds to the top portion of the curve of the figure, and the range of frequencies at which signals cannot be extracted corresponds to the bottom portion of the curve of the figure.

Therefore, when the center frequency $f_0$ of such a binomial pulse is applied where the frequency is made to match the resonance frequency of protons of water, the protons of water are not excited. However, the protons of macromolecule are excited in a bottom portion of 500 Hz or above. Thus, it is possible to decrease the level of the MR signals from the macromolecule in the imaging sequence performed subsequently to the above. By selectively irradiating protons of macromolecule beforehand by using a binomial pulse as described above, it is possible to obtain the above-described MTC effect.

Meanwhile, in the MR image acquisition, as fat which is said to have a small clinical significance does not appear in the image, a so-called imaging method capable of suppressing MR signals from fat is often used. There are a number of imaging methods in which MR signals coming from fat is suppressed. In one of them, a method of using a binomial pulse capable of irradiating protons in a frequency selecting manner is known.

Since, as described above, the level of signals which appear in a later imaging sequence decreases in the bottom portion of magnetization Mz of the binomial pulse, the binomial pulse is set in such a way that the resonance frequency of protons contained in fat approaches the bottom portion.

FIG. 4 shows a 1331 pulse set in this manner. The time τ between the pulses is set at approximately 2.3 msec (longer) so that the resonance frequency of protons contained in water approaches the center frequency $f_0$ and the resonance frequency of protons contained in fat approaches the bottom portion offset toward the low frequency side by approximately 220 Hz from the center frequency $f_0$ of the protons contained in fat.

If such a binomial pulse is applied and then a normal imaging sequence is performed, it is possible to form only protons of free water into an image and suppress the level of MR signals from the protons contained in fat.

On one hand, in an MRI system, uniformity of a static magnetic field becomes a key factor to increase quality of an excitation spectrum (i.e., signal to noise ratio and resolution). Thus MRI systems are generally provided with an adjusting means with a shim coil in order to adjust the uniformity of the field. Particularly in medical use, it is preferred to prevent a patient from being placed in the diagnostic space of a magnet for a long time. Therefore, the first-order shimming (gradient shimming) in X-, Y-, and Z-directions, which is simply operated, is carried out to separate resonance frequencies of water and fat in a spectrum.

However, since the length of the entire pulse becomes as much as approximately 7 msec in the 1331 pulse, this makes a repetition time TR longer. In other words, this pulse has the problem that it is difficult to use the signal for an ultra-fast scan and angiography in which the repetition time TR is made short and used.

If, in contrast, the pulse interval τ is made short for decreasing the repetition time TR, another problem occurs, for example, the top portion of the graph of magnetization Mz is expanded and fat is also formed into an image, decreasing the suppression effect of MR signals from fat.

Further, the prepulse is liable to be influenced by ununiformity of the static magnetic field, thus decreasing quality of images. Furthermore, since a frequency range distant from the resonance of water is excited (that is, off-resonance), an MTC effect will also occur, decreasing a signal to noise ratio correspondingly to it.

On one hand, there is a drawback with respect to the aforementioned first-order shimming. It is impossible for the first-order shimming to achieve complete uniformity of the static magnetic field; there will be turbulence in higher-order magnetic components of the static magnetic field. This ununiformity of higher-order magnetic components frequently cause the curve of water to deviate from the center frequency $f_0$ of a prepulse (for instance, a binomial pulse of 1331).

FIG. 5 exemplifies a change in frequency as a slicing position changes, which is caused by the ununiformity of the higher-order magnetic components. The degree of deviation of a certain frequency $f=f_1$ becomes noticeable as the slicing position is distant from the center in the slicing direction. In case that a prepulse is used in multi-slice imaging in order to suppress MR signals from fat, the aforementioned first-order shimming is effective in making the resonance curve of water coincide with the center frequency $f_0$, as shown in FIG. 6A, for the central slicing plane in the slicing direction, the central slicing plane usually being coincident with an iso-center. However, at slicing positions moved from the center in the slicing direction, the above-said higher-order magnetic components may cause the resonance curve of water to deviate from the center frequency $f_0$ of a prepulse, as shown in FIG. 6B, with the result that the resonance curves of water and fat move out of the top and bottom portions of the prepulse, respectively. In consequence, when the multi-slice imaging is carried out, there is a problem that image quality alters with changed slicing positions, because slicing planes at the central position and its neighboring positions in the slicing direction have a great suppressing effect of MR signals from fat, while other slicing planes distant from the central slicing position have a less suppressing effect of it.

SUMMARY OF THE INVENTION

The present invention has been achieved in view of the above-described circumstances. An object of the present invention is that, when multi-slice imaging is carried out using a pulse sequence including a prepulse for suppressing MR signals from fat, it is possible to avoid a decrease in such suppression effect which results from turbulence in higher-order magnetic components, thus obtaining stable and high quality MR images over a plurality of slicing planes.

To achieve the above object, as an aspect of the present invention, there is provided a system for magnetic resonance imaging, in which a prepulse is first applied to an object being examined placed in a static magnetic field for suppressing an MR signal from fat of the object and a pulse sequence including an RF pulse for multi-slice imaging of a plurality of slicing planes is then applied to the object for requiring image data, the system comprising: an element for performing a shimming increasing uniformity of the static magnetic field; an element for detecting, every one of the slicing planes, an offset value offsetting a frequency shift of a spectrum distribution caused by turbulence in higher-order components of the static magnetic field; and an element for correcting, every one of the slicing planes, a frequency range of the prepulse in accordance with the offset value detected by the detecting element.

It is preferred that the shimming is a first-order shimming. Preferably, the correcting element is an element for correcting a frequency of the RF pulse in compliance with the detected offset value. Preferably, the prepulse is one of a binomial pulse, a sinc function pulse, and a Gaussian function pulse.

Also it is preferred that the detecting element includes an element for calculating the offset value using a reference peak on the spectrum distribution of a slicing central plane positioned at a center in a slicing direction through the plurality of slicing planes. Preferably, the reference peak is a frequency spectrum peak of either one of water or fat signal of the central slicing plane. Still preferably, the reference peak is a frequency spectrum peak of a reference reagent placed outside the object.

BRIEF DESCRIPTION OF THE DRAWINGS

The accompanying drawings which are incorporated in and constitute a part of this specification, illustrate embodiments of the present invention and, together with the description, serves to explain the principles of the present invention. In the drawings.

DESCRIPTION OF THE PREFERRED EMBODIMENTS

A first embodiment of the present invention will be explained below with reference to FIGS. 7 to 10.

Figure 1:
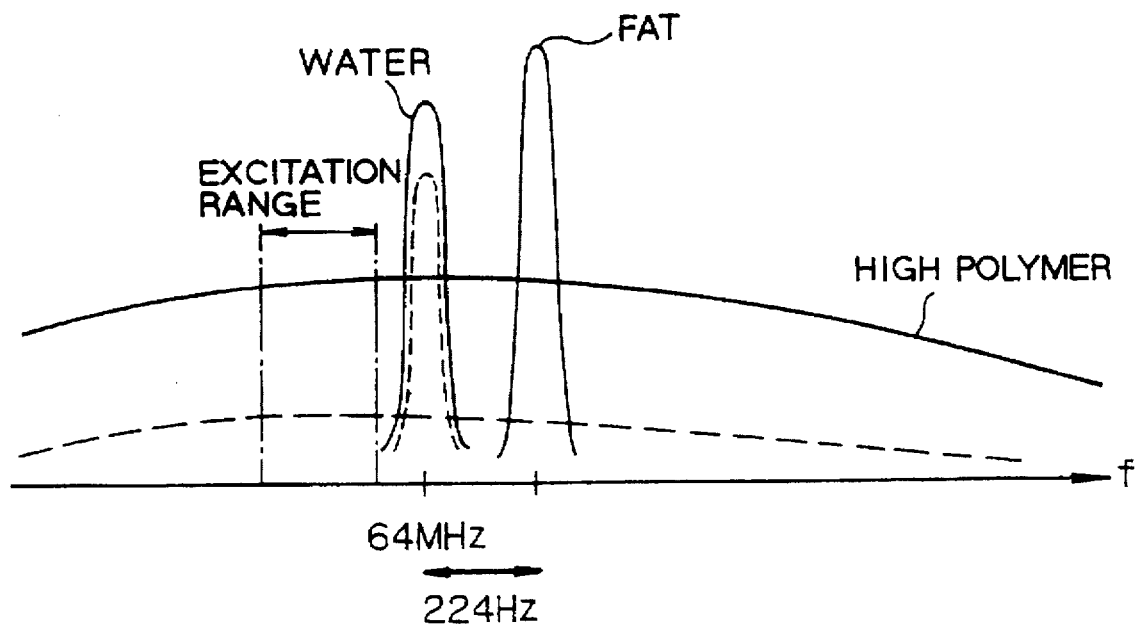
FIG. 1 is a spectrum view of protons contained in water, fat and macromolecule.
Figure 2:
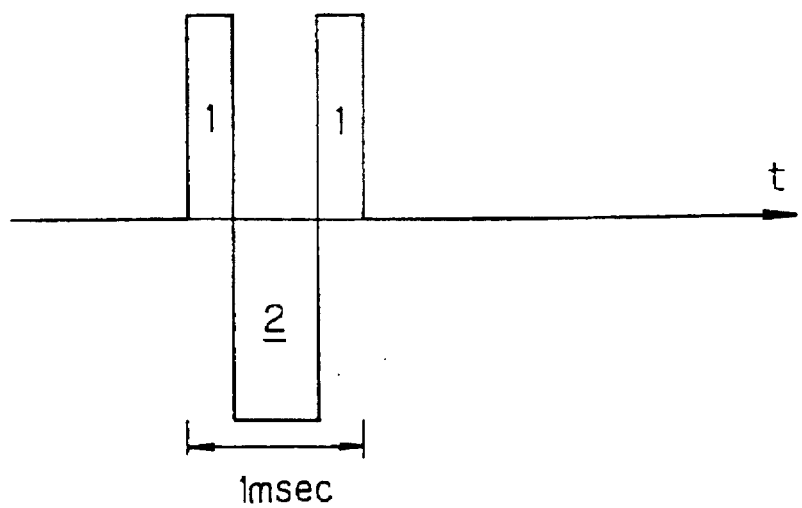
FIG. 2 is a graph illustrating a pulse for selectively irradiating protons of macromolecule.
Figure 3:
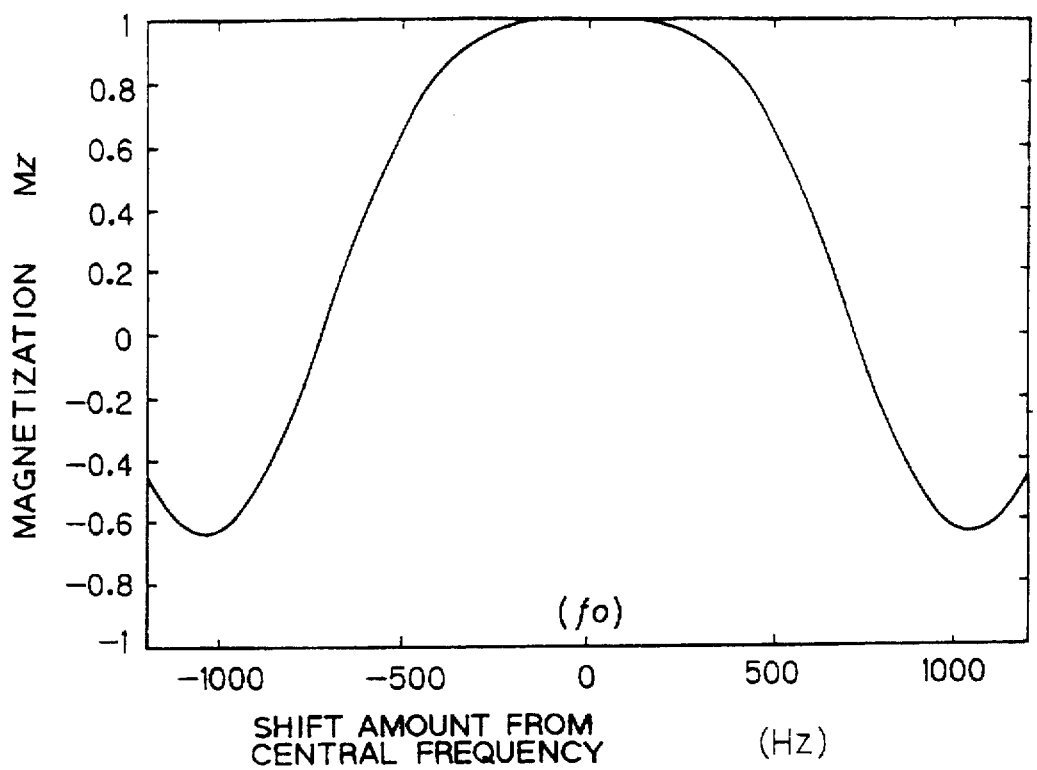
FIG. 3 is a curve illustrating the magnetization characteristics of a 121 pulse.
Figure 4:
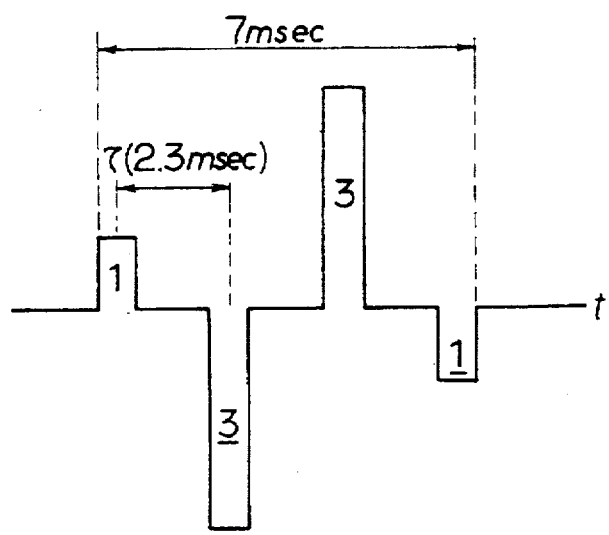
FIG. 4 is a curve illustrating a 1331 pulse.
Figure 5:
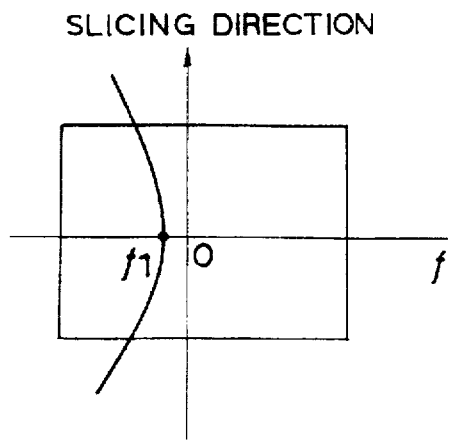
FIG. 5 is a curve showing a deviation in frequency caused by turbulence of higher-order components of a static magnetic field.
Figure 6A:
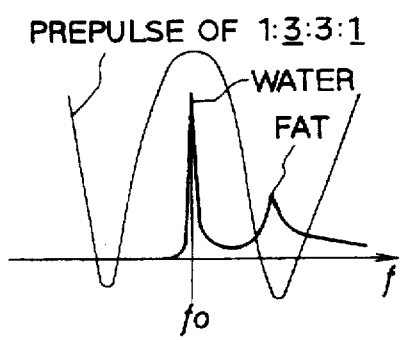
FIG. 6A is an illustration showing a matched state between a prepulse and resonance curves of water and fat.
Figure 6B:
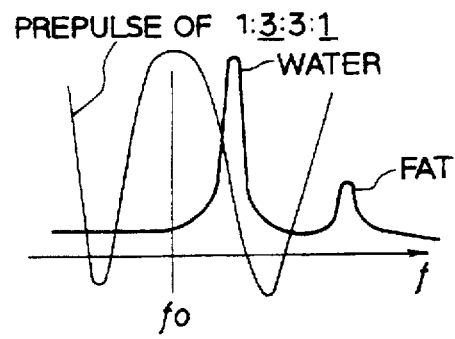
FIG. 6B is an illustration showing a missmatched state between a prepulse and resonance curves of water and fat.
Figure 7:
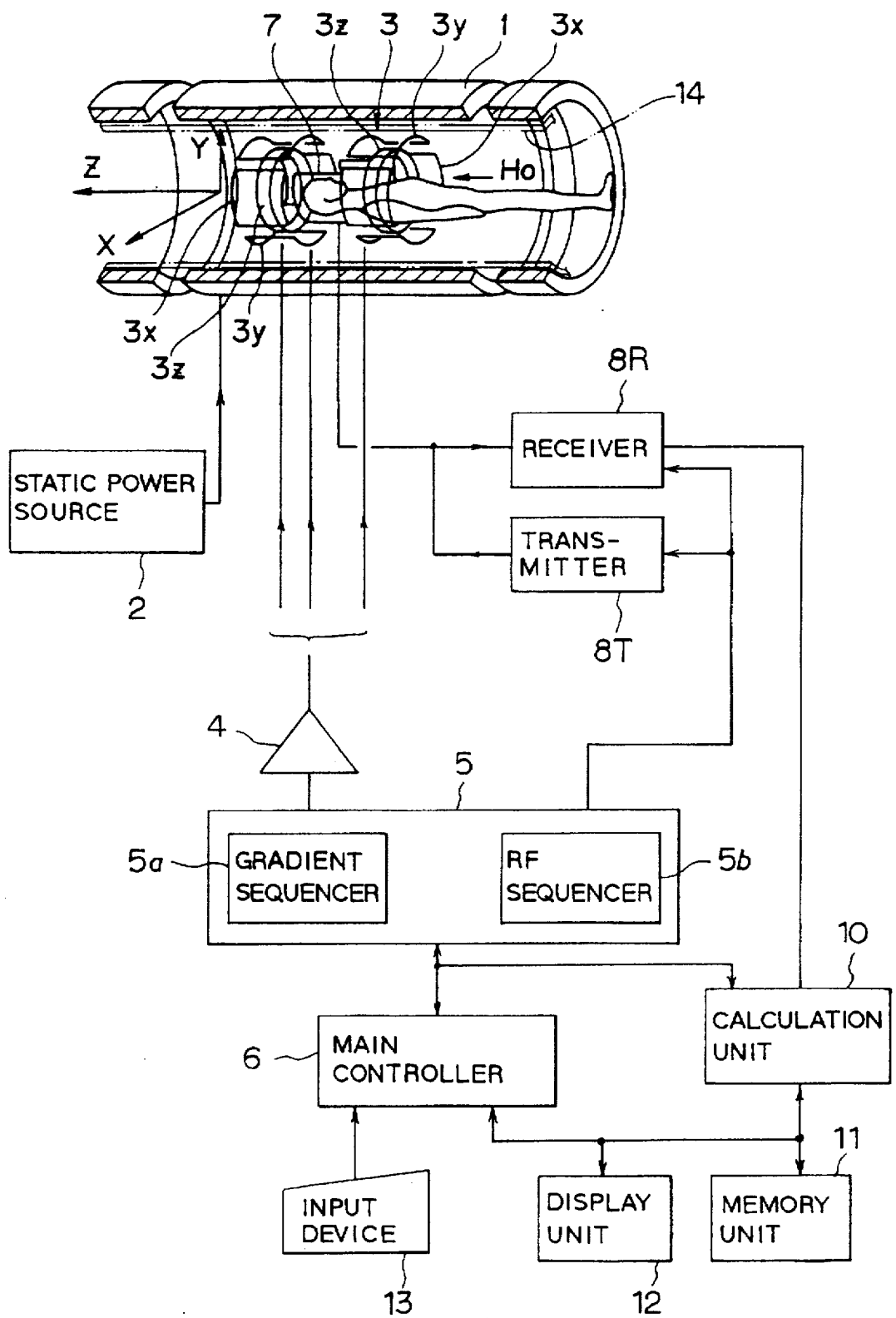
FIG. 7 is a general block diagram of a magnetic resonance imaging system of a first embodiment according to the present invention.

FIG. 7 shows in a general block diagram the magnetic resonance imaging (MRI) system of this embodiment.

The MRI system shown in FIG. 7 comprises a magnet 1 generally formed into a cylinder shape having a hollow portion therein for placing a patient, and a static power source 2 for supplying required electric current to the magnet 1. When the magnet 1 works, a static magnetic field Ho, being directed in Z-direction along the body axis of the patient, is formed in the central diagnostic space in the hollow portion.

In the hollow portion, there is provided a gradient coil portion 3. The coil portion 3 includes x-coils $3x \ldots 3x$ for generating a reading-out field gradient in X-direction, y-coils $3y \ldots 3y$ for generating a phase-encoding field gradient in Y-direction, and a z-coil $3z$ for generating a slicing field gradient in Z-direction. These gradient coils are connected, through a gradient power source 4, to a gradient sequencer 5a arranged in a sequencer 5 controlled by a main controller 6.

An RF coil 7 is disposed in the inner space of the magnet 1, whereby the patient is surrounded by the RF coil 7 and the gradient coils $3x \ldots 3z$. The RF coil 7 is in charge of transmitting and receiving radio frequency (RF) magnetic pulses to and from the patient. The RF coil 7 is also connected, through a transmitter 8T and a receiver 8R, to an RF sequencer 5b of the sequencer 5.

The main controller 6 has a computer for entire control of this MRI system. The sequencer 5 is also provided with a computer which stores programs of pulse sequences such as FE (Field Echo) and fast SE (Spin Echo) methods. In response to a start signal from the main controller 6, the sequencer 5 will supply pulsed currents to the gradient coils $3x \ldots 3z$ and the RF coil 7 in accordance with a specified pulse sequence.

MR signals emitted from the diagnostic portion of the patient will be detected by the RF coil 7 and received by the receiver 8R to send the MR data to a calculation unit 10, where the MR data being formed into image data by reconstruction processing such as Fourier transformation. The image data can be memorized in a memory unit 11 and displayed by a display unit 12. An input device 13 is provided for inputting necessary information from an operator.

Furthermore, in this embodiment, there is disposed a shim coil 14 for the first-order shimming (gradient shimming) in the hollow portion of the magnet 1. Hence the first-order shimming can be done by regulating current supplied to the shim coil 14.

Figure 8:
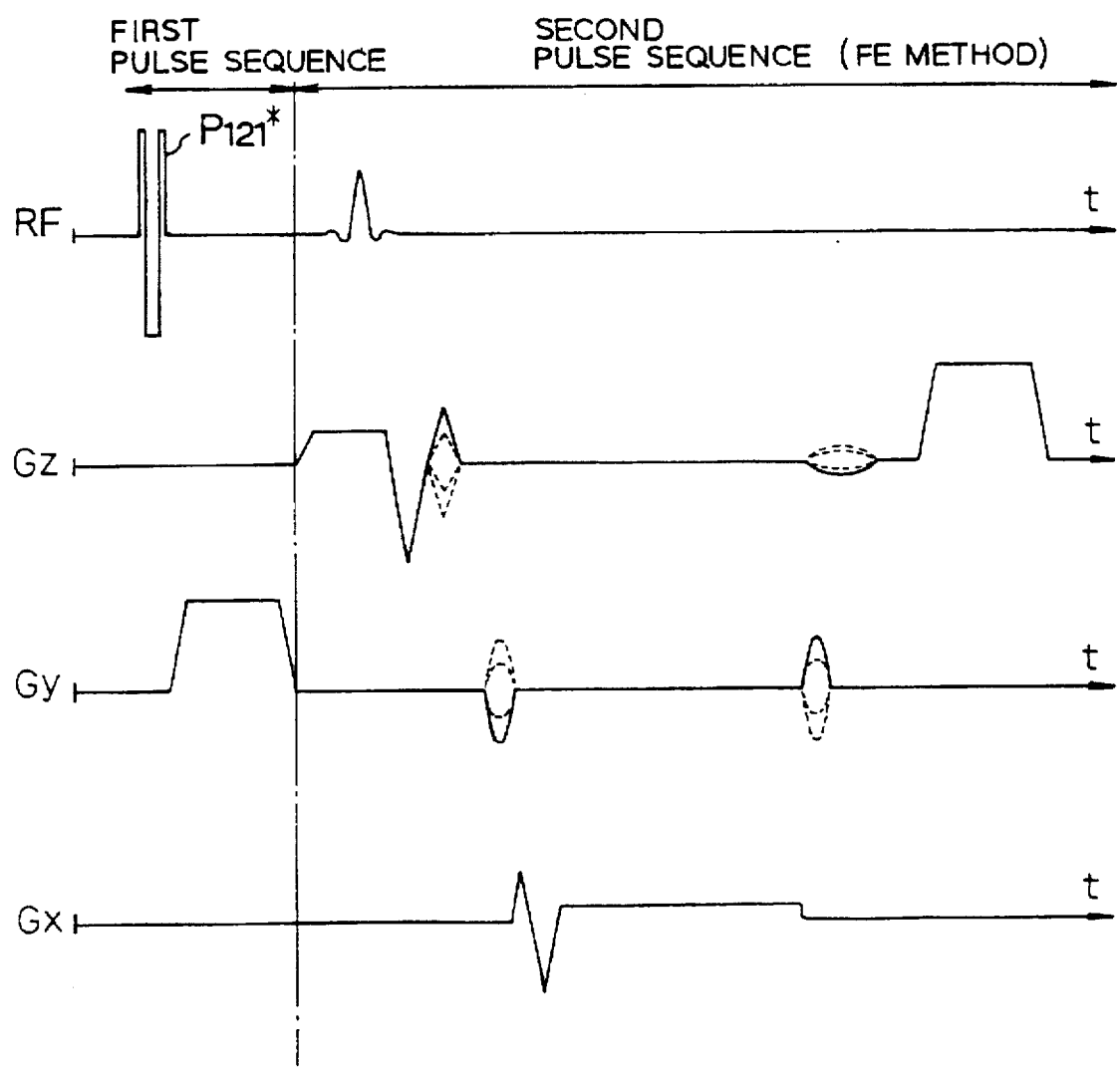
FIG. 8 is a pulse sequence chart illustrating an MR image pickup method of the first embodiment.

FIG. 8 shows a pulse sequence performed by the sequencer 5 having the gradient sequencer 5a and RF sequencer 5b.

As can be seen in the figure, the sequencer 5 is designed to perform a first sequence in which the binomial pulse is applied and a second sequence in which MR image data is collected. It is preferable that the second sequence be performed by an FE method as shown in the figure.

In the first sequence, a 121 pulse $P_{121}*$ is applied on condition that the center frequency of the 121 pulse $P_{121}*$ is offset by a predetermined offset amount toward the high frequency side. The sign "*" attached to the reference numeral herein shows that the prepulse can be offset in frequency. The amount of offset, which is predetermined by prescan and memorized, for example, is preferably from 1.0 ppm to 4.0 ppm and, more preferably, from 1.5 ppm to 3.0 ppm. In this case, the frequency becomes from 50 Hz to 250 Hz, and from 100 Hz to 200 Hz, respectively under the magnetic field of, for example, 1.5 tesla.

To perform an MR imaging by using the magnetic resonance imaging system of this embodiment, initially, the first sequence including the binomial pulse $P_{121}*$ is performed. Thus, offsetting the binomial pulse $P_{121}*$ leads to a situation that the protons contained in fat and macromolecule are excited.

Figure 9:
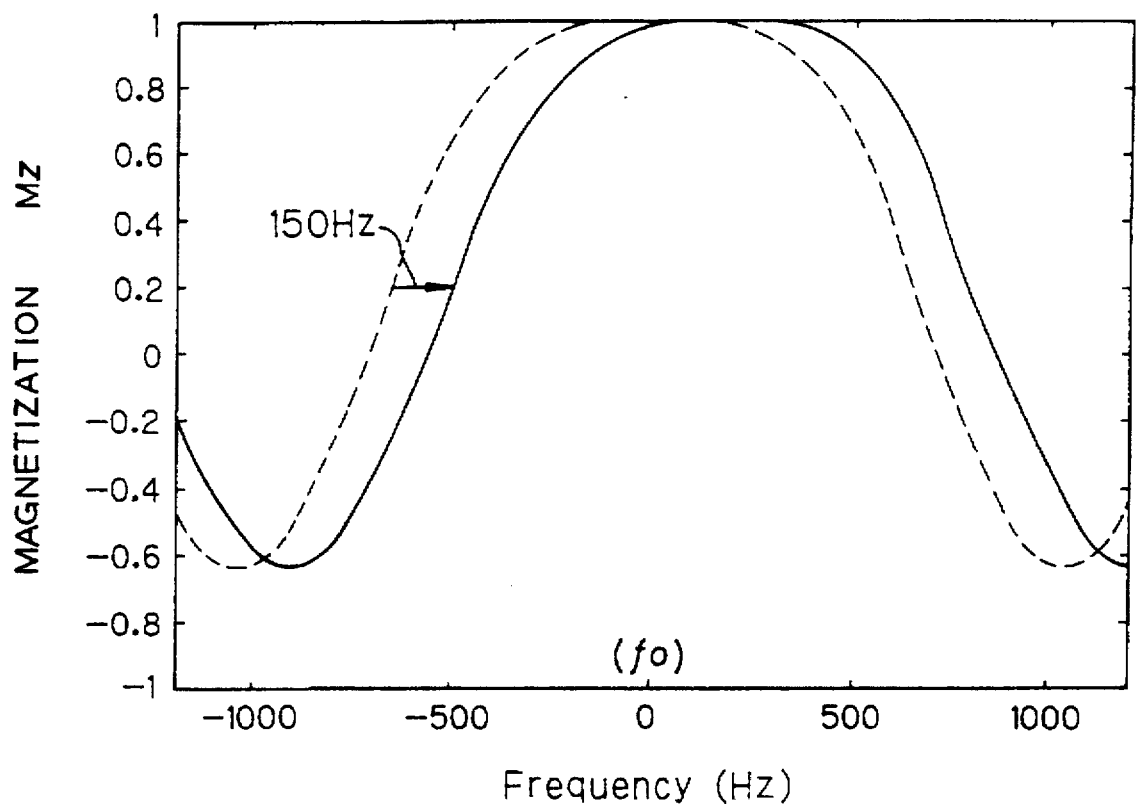
FIG. 9 is a graph illustrating a magnetization curve when a binomial pulse is offset by 150 Hz toward the high frequency side.

FIG. 9 is a graph illustrating the magnetization Mz curve when the binomial pulse $P_{121}*$ is offset by, for example, 150 Hz, toward the high frequency side.

As can be seen in the figure, since the vicinity of the resonance frequency of water is a top portion, the protons are not excited. However, since the resonance frequency of protons contained in fat, i.e., near −220 Hz, approaches the bottom portion, the protons are excited by a predetermined amount. The protons contained in macromolecule are excited at the bottom portion.

Next, the second sequence is performed to collect MR image data. Since the fat and macromolecule are already excited in the first sequence, the level of MR signals obtained in the second sequence is low. The level of signals of the macromolecule becomes low in the same manner. Meanwhile, since protons contained in water are not excited in the first sequence, strong MR signals can be obtained in the second sequence.

As described above, in the MR imaging method and the magnetic resonance imaging system of this embodiment, the center frequency of the binomial pulse is offset toward the high frequency side by a predetermined offset amount with respect to the resonance frequency of protons contained in water and the binomial pulse is applied so that the protons contained in fat and macromolecule are excited. Therefore, it is possible to greatly reduce the level of MR signals from fat. Therefore, it is possible to form fine blood vessels, which cannot be seen because these are concealed in fat, into an image.

Figure 10:
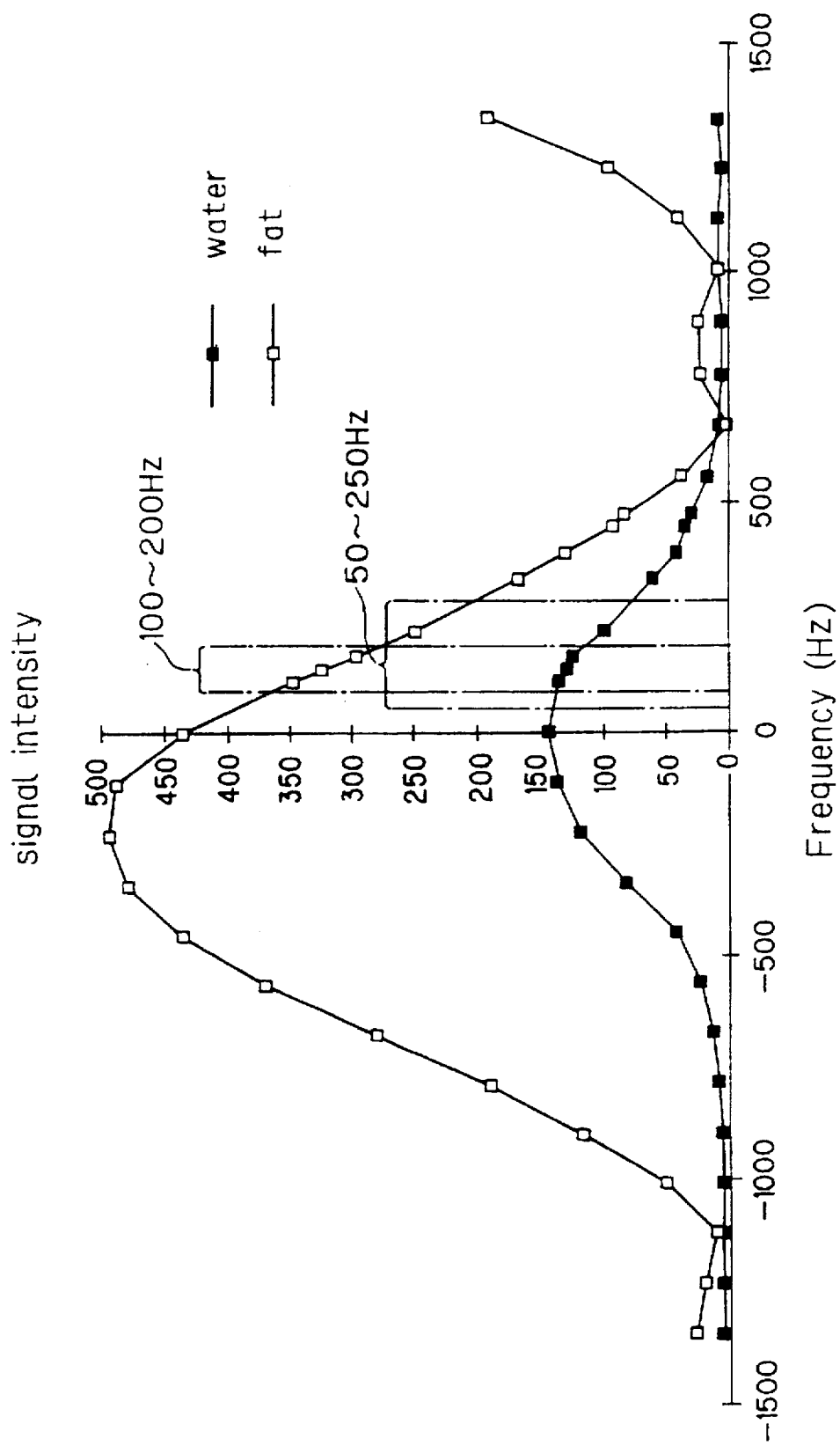
FIG. 10 indicates experimental data obtained by measuring the intensity of signals output from water and fat.

FIG. 10 indicates experimental data obtained by measuring the intensity of signals output from water and fat, and the offset amount is shown as the horizontal axis.

As can be seen in the figure, when the offset amount was made from 1.0 ppm to 3.8 ppm, the intensity of signals from water becomes from approximately 100% to 50%, and the intensity of signals from fat becomes from approximately 90% to 45%. When the offset amount is made from 1.5 ppm to 3.0 ppm, whereas it is possible to secure the intensity of signals from water to be from approximately 96% to 84%, it is possible to reduce the intensity of signals from fat to be from 84% to 63%.

Also, the MR imaging method and the magnetic resonance imaging system of this embodiment makes it possible to not only reduce the level of signals from fat, but also reduce the level of signals from macromolecule. Thus, the MTC effect can be obtained. In this embodiment, in particular, since the binomial pulse is offset, the frequency band at which macromolecule is excited approaches the resonance frequency of water, making it possible to obtain an MTC effect higher than in the prior art in which the binomial pulse is not offset.

Such a suppression effect of MR signals from fat and an MTC effect can be easily obtained by performing the first sequence prior to the ordinary imaging sequence, and there is hardly no need to extend the repetition time (TR).

Therefore, the MR imaging method and the magnetic resonance imaging system of this embodiment are very effective means for a pulse sequence, for example, an ultrafast scan and angiography in which TR is made short and used.

In processes other than angiography, it becomes possible to obtain the MTC effect while suppressing MR signals from fat.

The MR imaging method and the magnetic resonance imaging system of this embodiment have another advantage that it is possible to suppress the MR signals from veins and to intensify signals from arteries.

Although in the above-described embodiment, a 121 pulse is used as being the binomial pulse, the binomial pulse is not limited to this pulse. A 1331 or 14641 pulse may also be used. With such a construction, the degree of the separation of water from fat is further improved.

Next, a second embodiment of the present invention will be explained according to FIGS. 11A and 11B to 15. For simplifing or omitting explanation of the embodiments described hereinafter, the same reference numerals as the above first embodiment will be used for the same or equivalent components or processes.

The second embodiment relates to prevention in deterioration of suppression of MR signals from fat in multi-slice imaging.

Figure 11A:
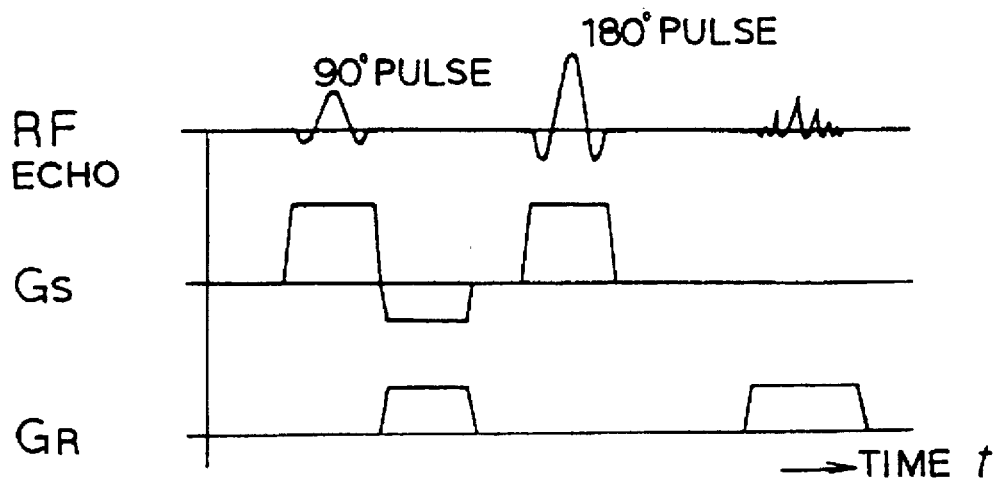
FIG. 11A is a pulse sequence for shimming according to a second embodiment of the present invention.
Figure 11B:
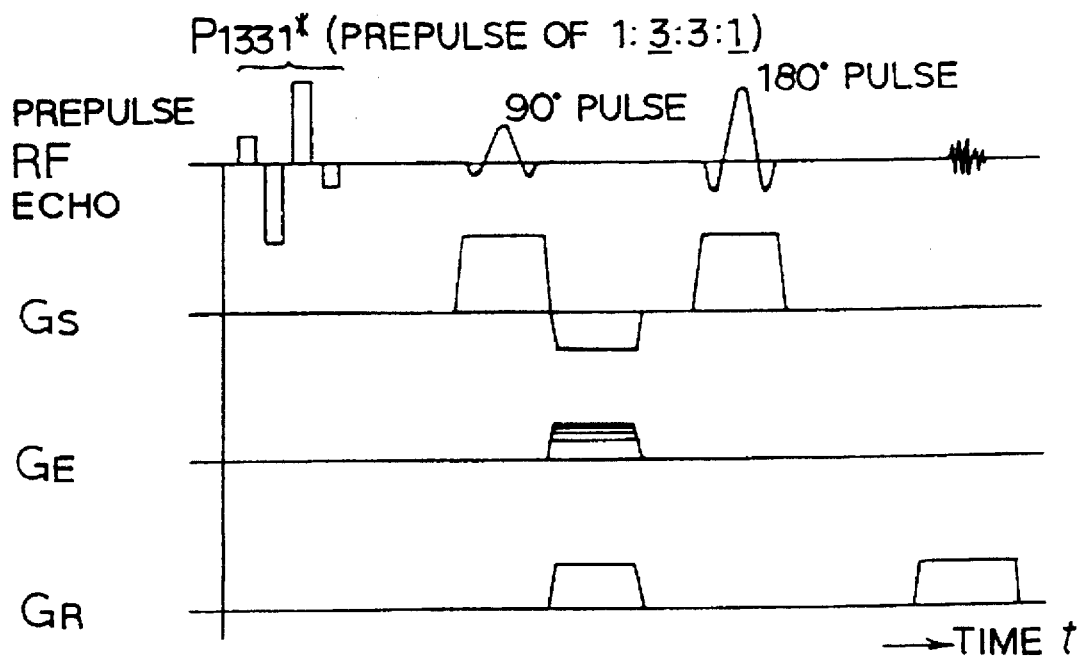
FIG. 11B is a pulse sequence for imaging in the second embodiment.
Figure 12:
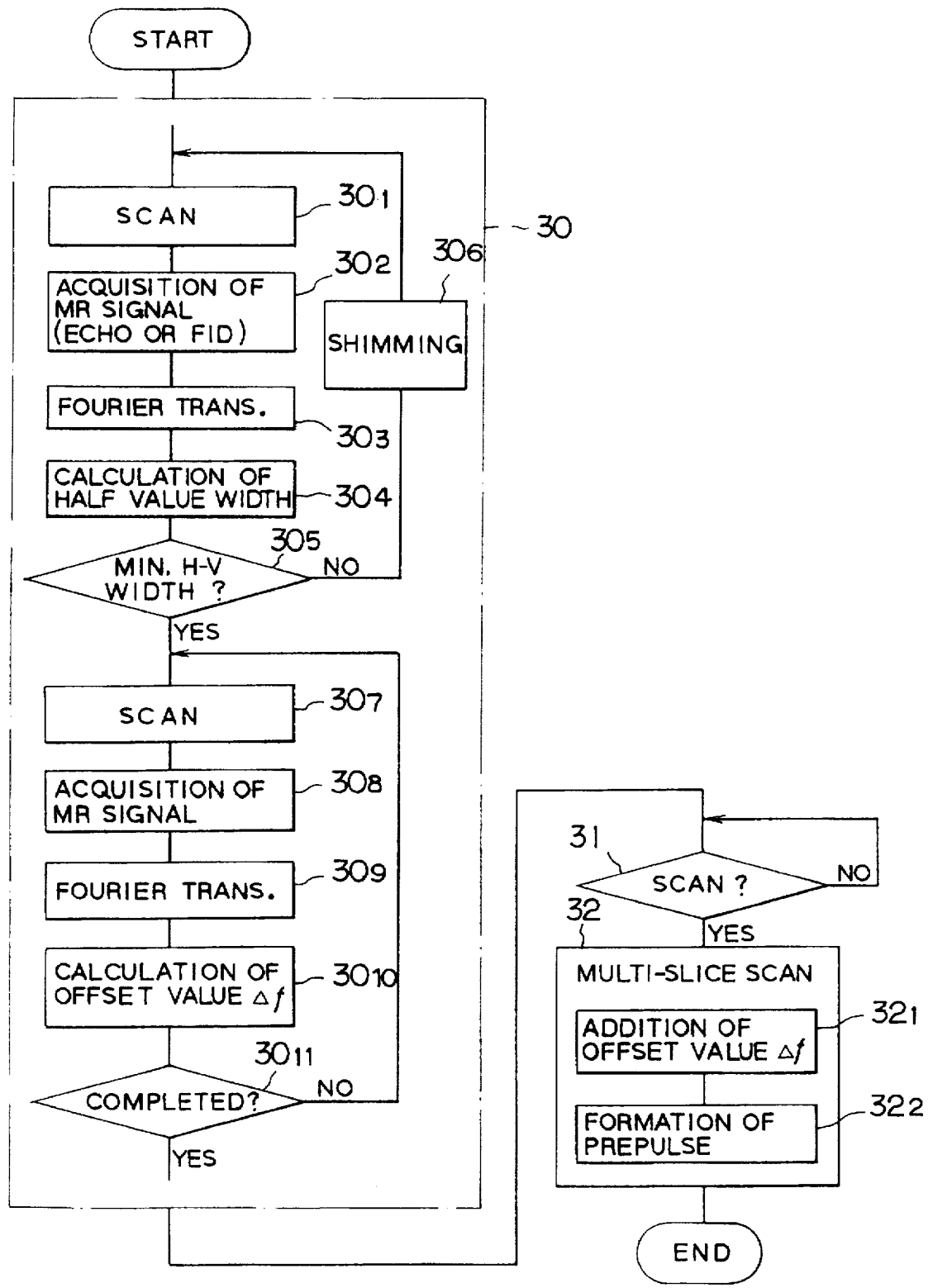
FIG. 12 is a flowchart for performing the pulse sequences in the second embodiment.

To accomplish such purpose, an MRI system according to the second embodiment adopts the same hardware as the first embodiment, in which the controller 6, sequencer 5 and calculation unit 10 are designed to carry out cooperatively a series of processes shown in FIG. 12, which is in accordance with FIGS. 11A and 11B.

At the first step 30 in FIG. 12, for each of the X-, Y- and Z-axis directions, the first-order shimming (volume shimming) is to be carried out using, for example, a shimming pulse sequence shown in FIG. 11A, thus being able to obtain a uniform static magnetic field $H_0$. Also obtained are offset values $\Delta f \ldots \Delta f$ in frequency of a prepulse applied to each slicing plane. In this embodiment, a 1331 binomial pulse $P_{1331}*$ will be used as the prepulse, as shown in FIG. 11B.

In detail, a three-dimensional region to be diagnosed is excited by a 90° pulse to obtain an MR signal (echo or FID (free-induction decay) signal) (refer to Steps $30_1$ and $30_2$). The MR signal is then processed by Fourier transformation, so that obtained is a spectrum containing resonance curves $C_{WAT}$ and $C_{FAT}$ of water and fat as exemplified in FIG. 13

(refer to Step $30_3$). Half-value widths $W_{WAT}$ and $W_{FAT}$ are each calculated with respect to the resonance curves $C_{WAT}$ and $C_{FAT}$ of water and the value etc. of current supplied to the shim coil 14 (refer to FIG. 7) is adjusted in a manner that those half-value widths $W_{WAT}$ and $W_{FAT}$ will be minimized (refer to Steps $30_4$ to $30_6$). Such adjustment enables the resonance curves $C_{WAT}$ and $C_{FAT}$ of water and fat to preferably separate to each other.

Figure 13:
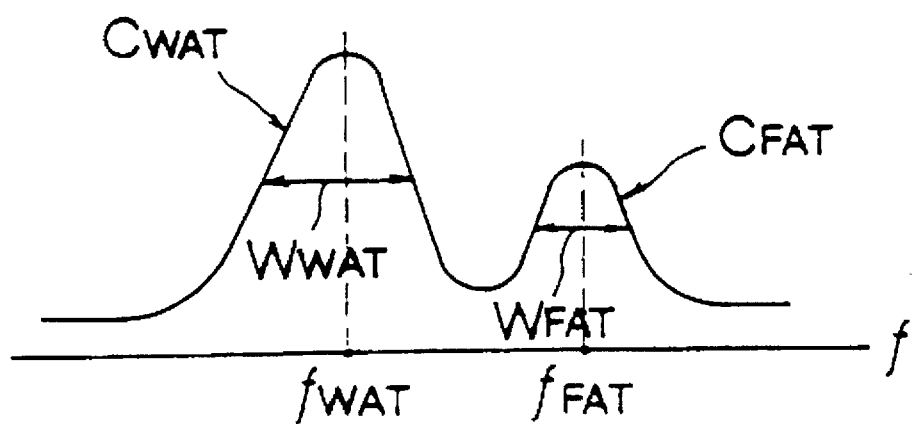
FIG. 13 is a spectrum in which the resonance curves of water and fat are separated.
Figures 14A, 14B:
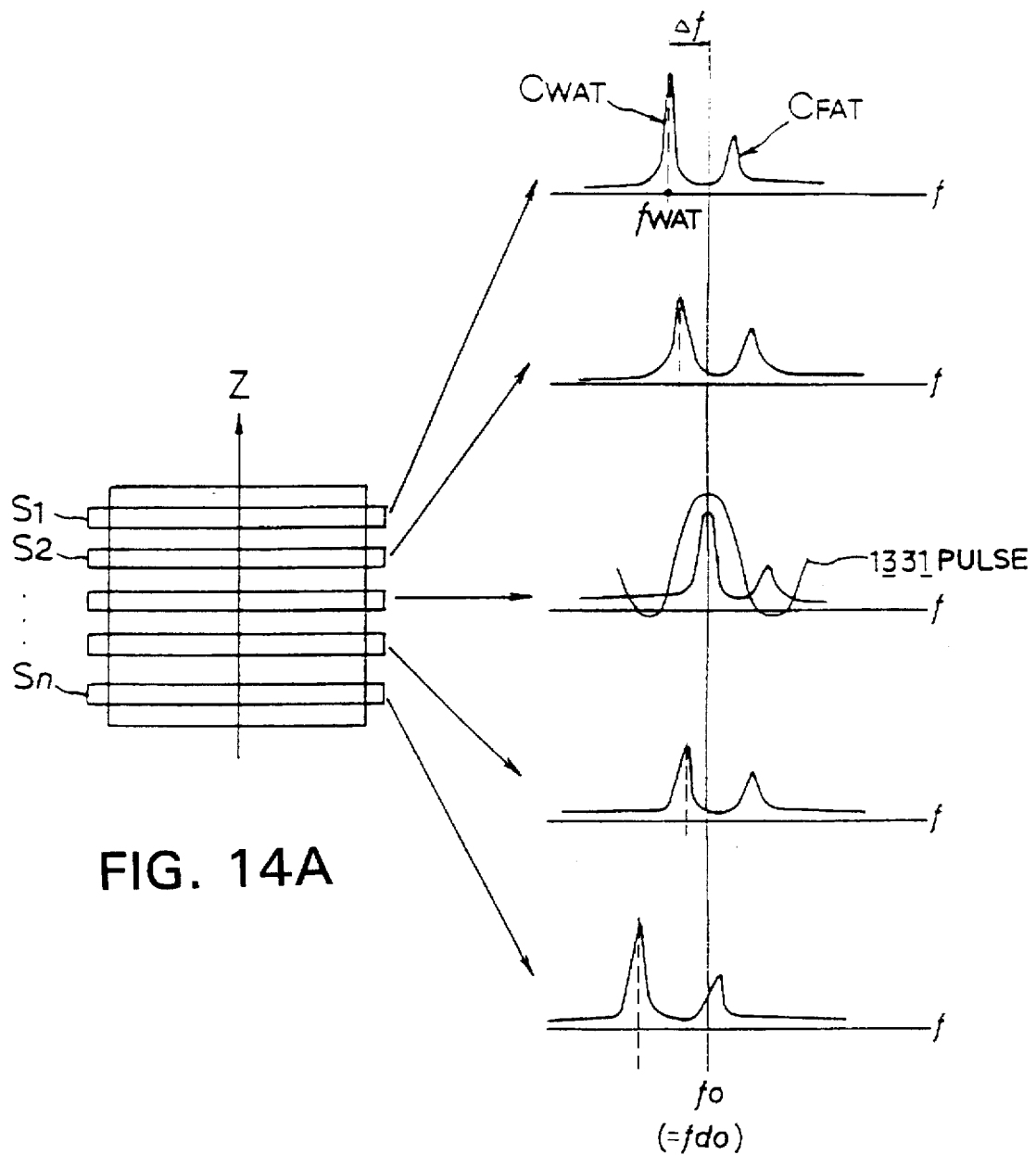
FIG. 14 is an illustration explaining calculation of an offset value at every slicing plane.

After completion of such first-order shimming for a certain volume to be diagnosed, processes at Steps $30_7$ to $30_{10}$ will be followed in sequence. Among them, Steps $30_7$ to $30_9$ are arranged to perform the same processes as ones at Steps $30_1$ to $30_3$ described before; the scan is carried out every slicing plane to acquire MR signals which will then be Fourier-transformed. As a result, a spectrum containing resonance curves $C_{WAT}$ and $C_{FAT}$ of water and fat is obtained every slicing plane, as shown in FIG. 13.

Furthermore, a process at Step $30_{10}$ will be done, where the difference between the center frequency $f_0(=f_{a0})$ of the prepulse $P_{1331}*$ for the central slicing plane containing a designated iso-center in the slicing direction and the resonance frequency $f_{WAT}$ of water is calculated and memorized as an offset value $\Delta f(=f_{a0}-f_{WAT})$, assuming that the prepulse $P_{1331}*$ of 1331 is set at a frequency that provides the most effective suppression of MR signals acquired from fat. It should be noted that the frequency offset value $\Delta f=0$ at a central slicing plane in the slicing direction, as the central slicing plane (coinciding with the iso-center) is taken as a standard in this embodiment.

The above calculation of frequency offset values will be individually carried out for all the slicing planes (refer to Step $30_{11}$). As a result, as exemplified in FIG. 14, the frequency offset value $\Delta f(=\Delta f_1 \ldots \Delta f_n)$ for the prepulse $P_{1331}*$ of 1331 is obtained for each of a plurality of slicing planes $S_1 \ldots S_n$.

Figures 15A, 15B:
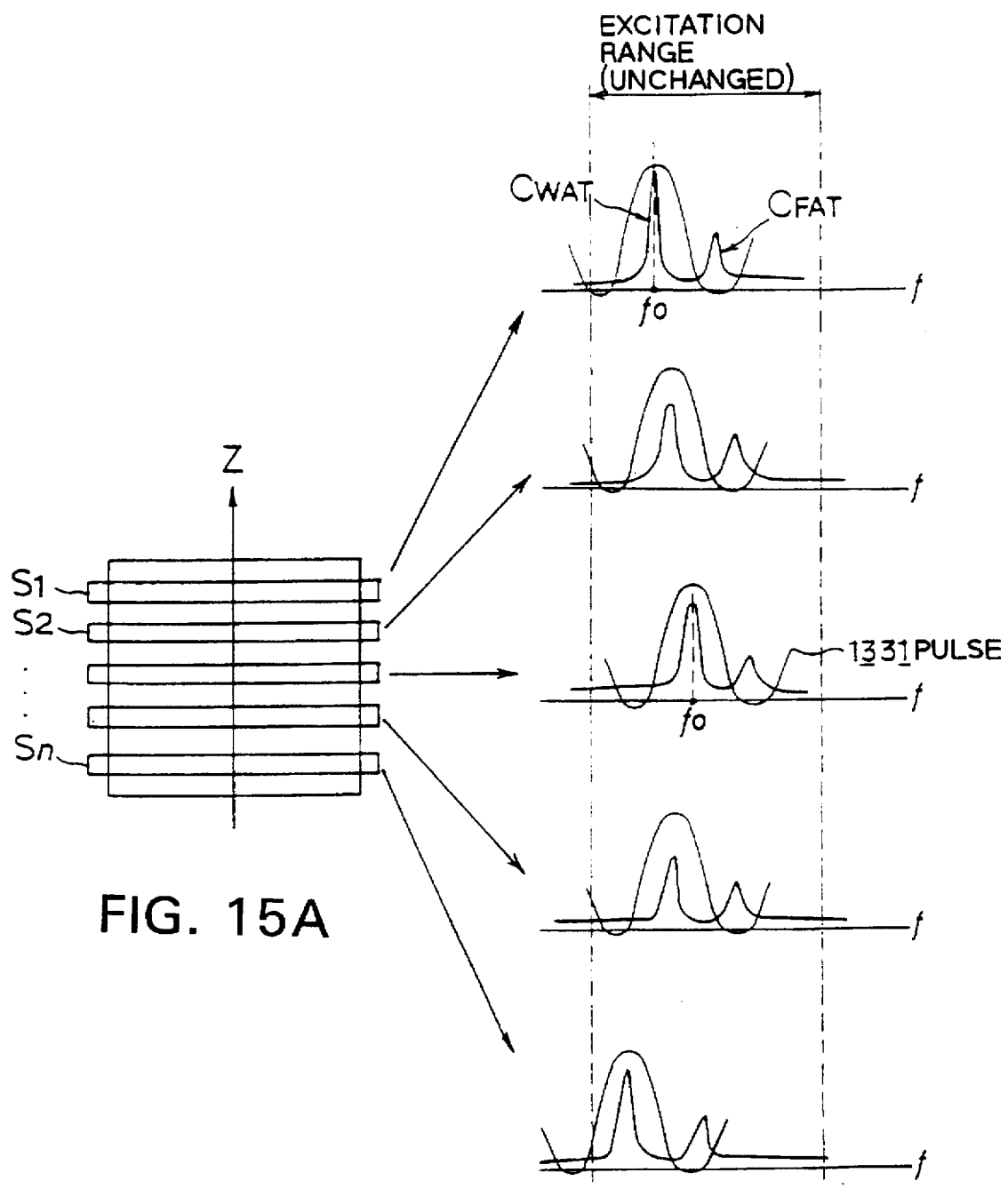
FIG. 15 is an illustration explaining offset of a prepulse every slicing planes.

Next, a multi-slice imaging will be done by applying the prepulse $P_{1331}*$ of 1331, as shown in FIG. 11B, before a scan sequence based on an SE (Spin Echo) method (refer to Steps 31 and 32). In the course of this sequence, the freqeuncy offset value $\Delta f$ of thus-calculated at Step $30_{10}$ is added to the prepulse $P_{1331}*$ for suppressing MR signals from fat, thus obtaining a corrected prepulse $P_{1331}*$ according to the addition (refer to Steps $32_1$ and $32_2$). Applying the prepulse $P_{1331}*$ thus-corrected to an object through the RF coil 7 allows the entire magnetization property curve caused by the prepulse $P_{1331}*$ to move toward the resonance curve $C_{WAT}$ of water on the frequency axis, every slicing plane. In consequence, at each spectrum of the slicing planes $S_1 \ldots S_n$ as shown in FIG. 15 (corresponding to FIG. 14), the center frequency $f_0$ of the prepulse $P_{1331}*$ coincides with the center of the resonance curve $C_{WAT}$ of water, even when the resonance curves $C_{WAT}$ and $C_{FAT}$ in a spectrum are moved every slicing plane because of higher-order turbulence in magnetic components of the static magnetic field $H_0$. The excitation range caused by the RF pulse is unchanged over all the slicing planes.

In this way, it is possible to exclude steadily the conventional drawback that both the specrum and the prepulse deviate from each other as a slicing plane is distant away from the center in the slicing direction. Namely, at any slicing plane, the top and bottom portions in magnetization property of the prepulse $P_{1331}*$ are preferably coincident with the resonance curves $C_{WAT}$ and $C_{FAT}$ in terms of their frequency positions, thus accomplishing the suppression of MR signals from fat more effectively, obtaining uniform and stable high-quality images over the slicing planes because of a decrease in ununiformity among the suppression effects of MR signals from fat of the slicing planes, and increasing reliability of the MRI system. Moreover, only the shim coil for the first-order shimming is required in this embodiment, thus avoiding the hardware construction of the shim coil from being larger. In addition, a period of preperation time is short, because higher-order shimming is not required.

Next, a third embodiment of the present invention will be explained with reference to FIGS. 16A and 16B through 19.

The magnetic resonance imaging apparatus of this embodiment is also concerned with a reduction in the effect of suppressing MR signals from fat in multislice imaging as in the above-described second embodiment. In both the second and third embodiments, a technique for suppressing MR signals from fat using prepulses is used. In the second embodiment, however, MR signals from fat are suppressed by adjusting the frequency band of a prepulse for each slice plane as described above, while in the third embodiment the frequency itself of an RF excitation pulse is adjusted for each slice plane.

Figure 17:
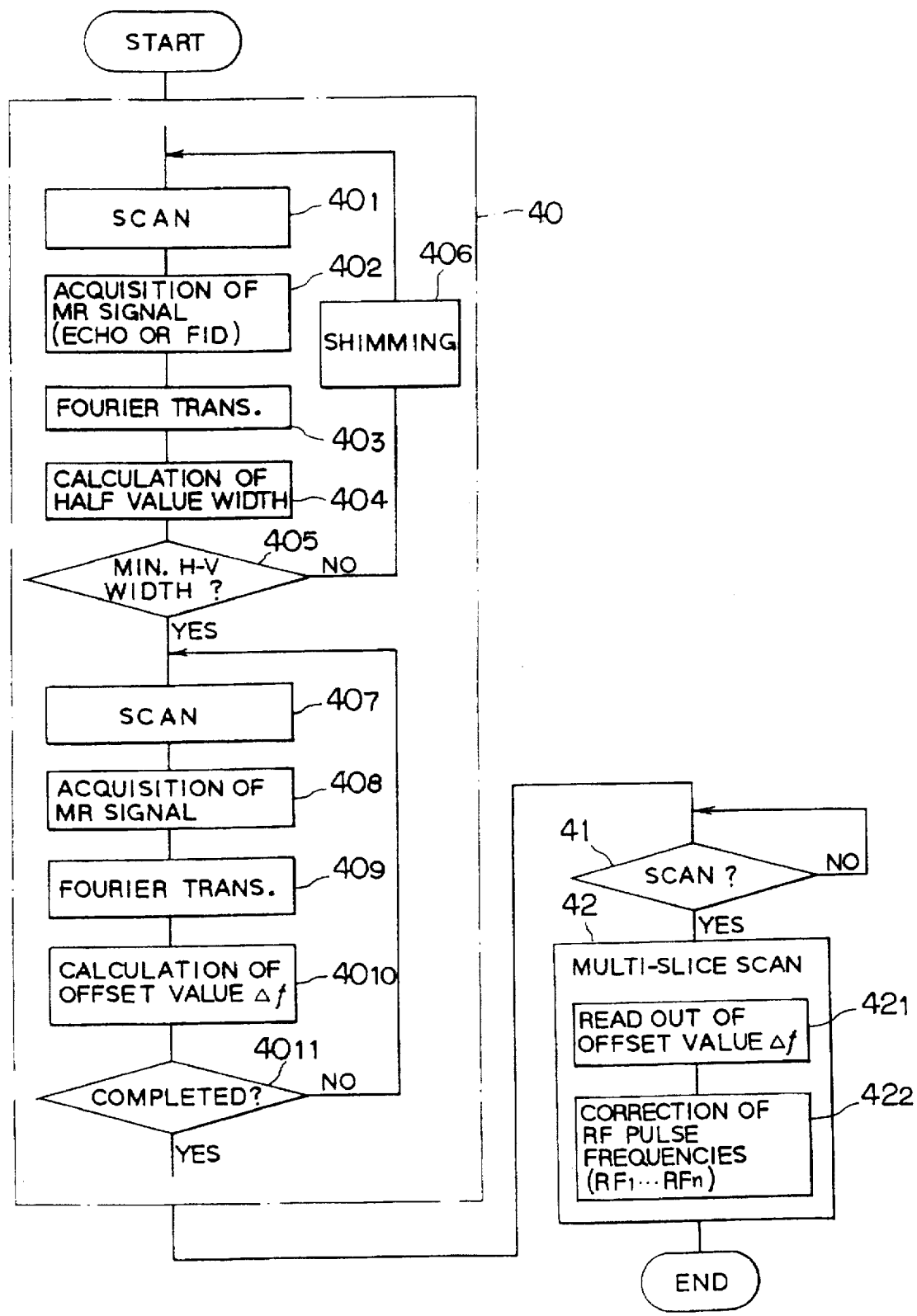
FIG. 17 is a flowchart for performing the pulse sequences in the third embodiment.

The magnetic resonance imaging apparatus of the third embodiment uses the same hardware as that of the first embodiment, and the controller 6, the sequencer 5, and the calculation unit 10 operate in cooperation to perform the operation of FIG. 11 in accordance with the sequence of FIG. 17.

Figure 16A:
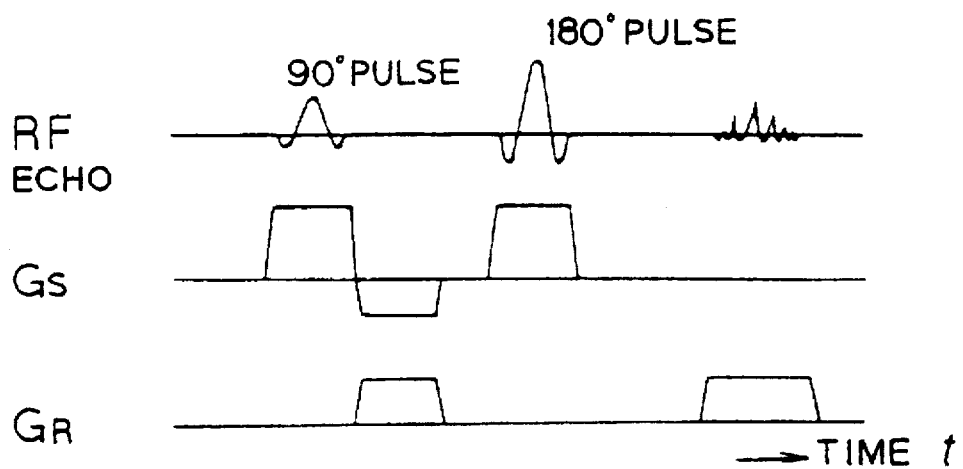
FIG. 16A is a pulse sequence for shimming according to a third embodiment of the present invention.

In the first Step 40 of FIG. 11, first-order shimming (volume shimming) along the X, Y and Z axes is performed by using the pulse sequence for shimming shown in FIG. 16A in order to make the static magnetic field $H_0$ uniform, and the offset $\Delta f$ with respect to the frequency of the RF pulse to be applied to the slice plane is computed for each slice plane.

In the sequence, Steps $40_1$ to $40_6$ indicate an outline of the operations for first-order shimming, and Steps $40_1$ to $40_6$ are the same as those of the above-described Steps $30_1$ to $30_6$ of FIG. 12. A higher-order shimming is also possible.

Figures 18A, 18B:
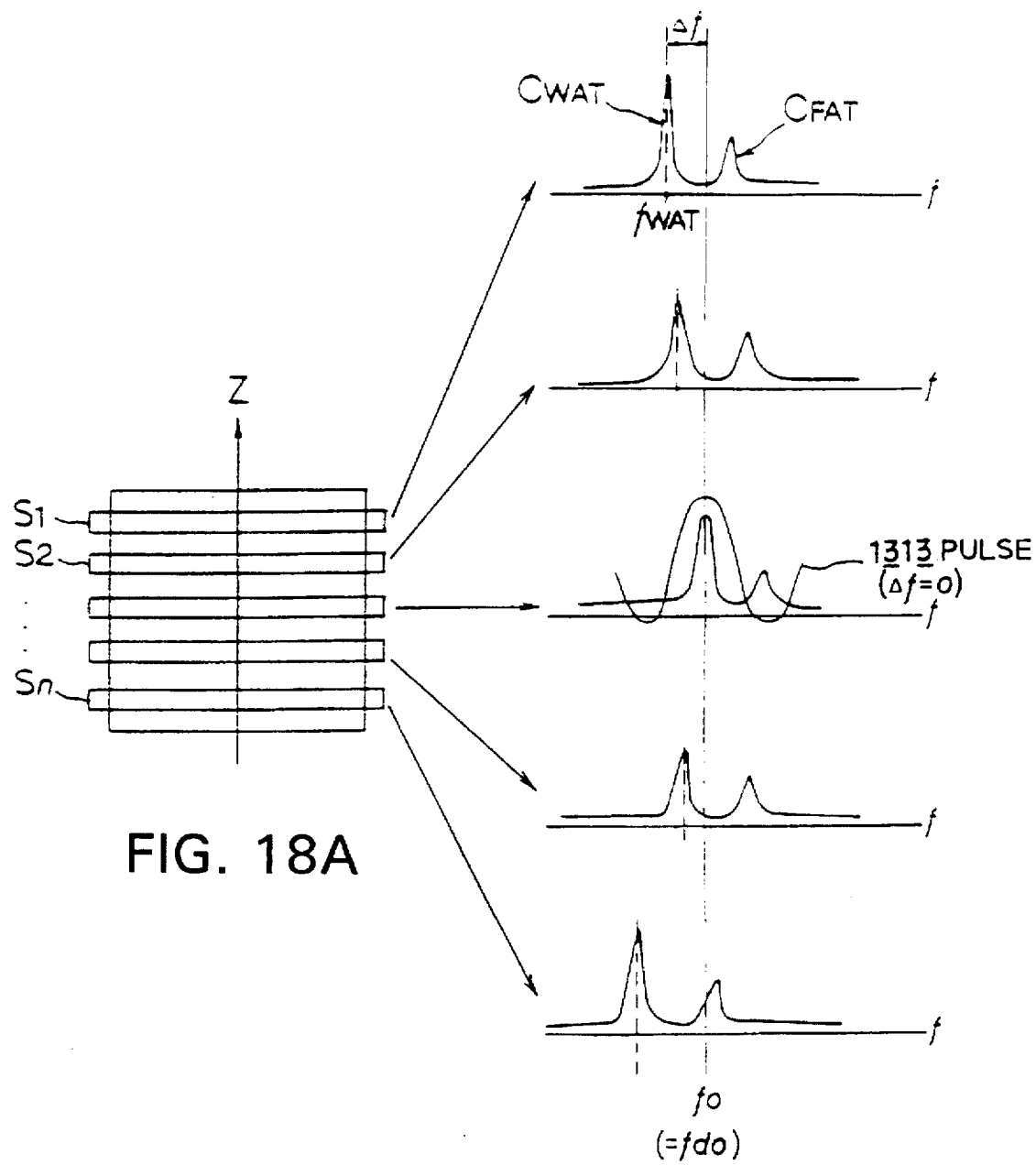
FIG. 18 is an illustration explaining calculation of an offset value at every slicing plane.

Upon the completion of the shimming, the operations of Steps $40_7$ to $40_9$ (scanning, MR signal acqusition, Fourier transformation) are performed in sequence in order to obtain a spectrum distribution of each slice plane including the resonance curves $C_{WAT}$ and $C_{FAT}$ of water and fat, respectively (see FIG. 18). Thereafter, the process proceeds to step $40_{10}$ where the shift of frequency between the center frequency $f_0$ (=$f_{a0}$) of a prepulse $P_{1331}$ when the prepulse $P_{1331}$ is set at the position of the frequency at which the fat suppression effect becomes highest and the resonance frequency $f_{WAT}$ of water as a reference peak is computed as the offset $\Delta f$ (=$f_{a0}$-$f_{WAT}$) and stored in a memory. Since in this embodiment, as shown in FIG. 18, the frequency position of the prepulse $P_{1331}$ is set by taking the center slice plane (the center slice plane including the iso-center position) as a reference, the frequency offset of the center slice plane is $\Delta f=0$. The computation of the offset $\Delta f$ is performed individually for all the slice planes (step $40_{11}$). As a result, the frequency offset $\Delta f$ (=$f_1, \ldots, \Delta f_n$) for the frequency of the RF pulse is determined for each of a plurality of slice planes of a volume site (for example, the abdomen) to be diagnosed.

Figure 16B:
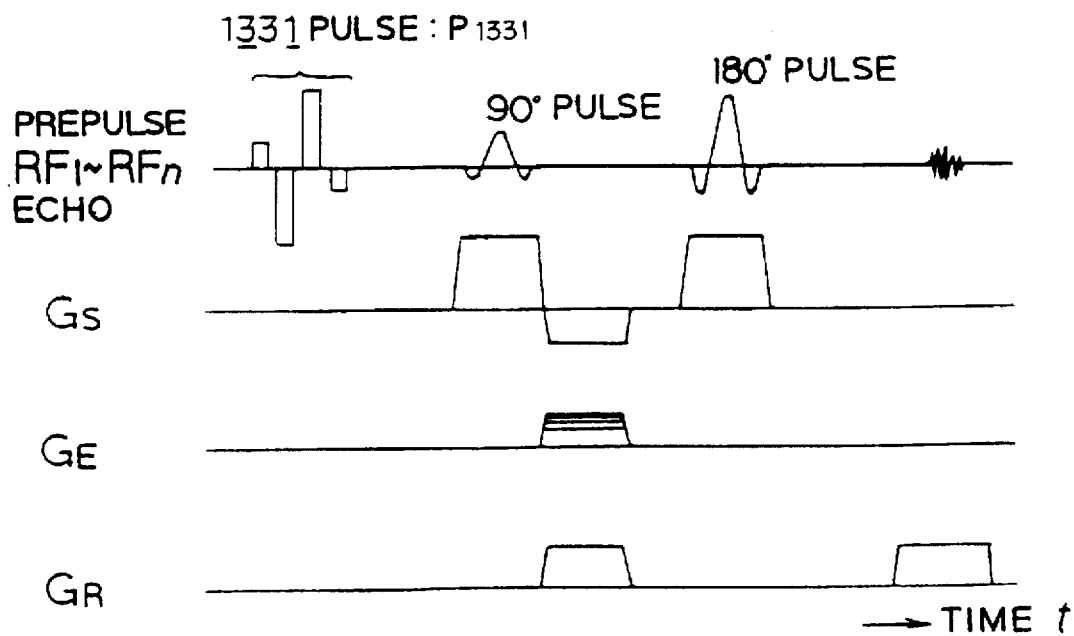
FIG. 16B is a pulse sequence for imaging in the third embodiment.

Thereafter, in Steps 41 and 42, the sequence of the SE method employing the 1331 prepulse $P_{1331}$ for suppressing MR signals from fat is performed as shown in FIG. 16B, and a multi-scan is performed. The frequency of the RF pulse for excitation is corrected for each slice plane $S_1$ ( ... $S_n$) while this sequence is performed.

To be specific, in Step $42_1$, the frequency offset $\Delta f=f_1$ ( . . . $\Delta f_n$) which has been previously computed and stored in Step $40_{10}$ is called from the memory, after which in Step $42_2$, the frequency offset $\Delta f$ is added to the frequency (e.g., 64 MHz: at 1.5 T) which is preset as a reference value, and the center frequency of the RF pulse: $RF_1$ ( ... $RF_n$ ) is each corrected. As a result, for example, the center frequencies $f_1$ ... $f_n$ of the RF pulses: $RF_1$ ... $RF_n$ of the slice planes $S_1$ ... $S_n$ are adjusted as described below at 1.5 T.

Figures 19A, 19B:
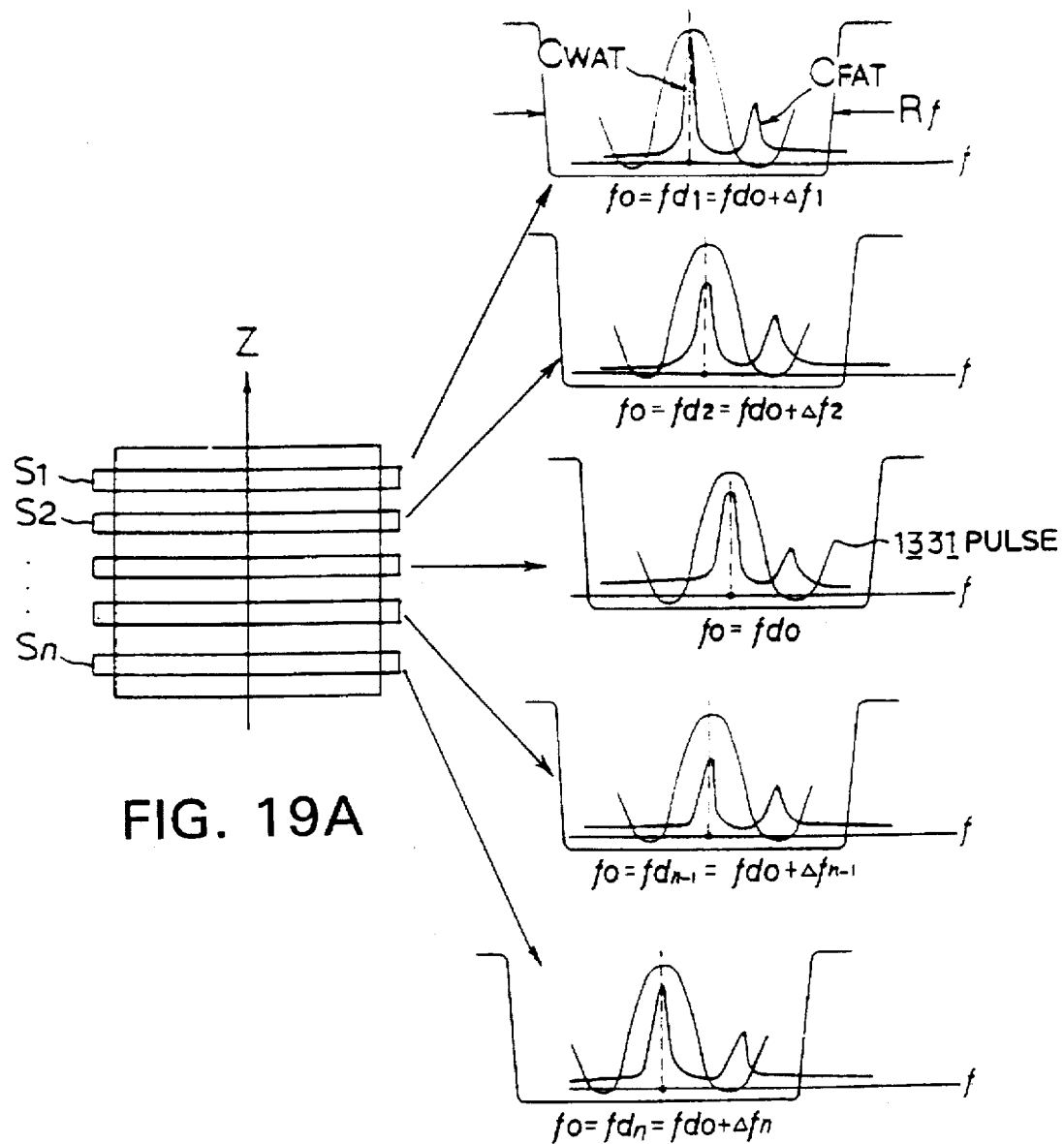
FIG. 19 is an illustration explaining offset of an RF pulse every slicing plane.

$f_1$ = 63999989 Hz
$f_2$ = 64000045 Hz
$f_i$ = 64000000 Hz (center slice plane)
$f_n$ = 63999955 Hz When the corrected RF pulses $RF_1$ ... $RF_n$ are applied from the RF coil, as shown in FIG. 19, the excitation range Rf itself moves along the frequency axis, and in response to this, the magnetization characteristic of the 1331 pulse for suppressing MR signals from fat moves along the frequency axis. That is, in each slice plane, the excitation range Rf and the magnetization characteristic move together along the frequency axis. The moved distance (frequency value) matches the above offset $\Delta f$ (=$f_1, \ldots, \Delta f_n$), and the offset $\Delta f$ is previously determined in proportion to the movement of the resonance curve of water in each slice plane $S_1$ ( .. . $S_n$). Thus, in each slice plane, as shown in FIG. 19, the center frequency $f_0$ of the 1331 prepulse $P_{1331}$ satisfactorily matches the center frequency of the resonance curve $C_{WAT}$ of water.

In other words, even after shimming was performed, for example, disturbances of high-order static magnetic field components (for example, two or more order components) remain and even if, on account of the above, the spectrum distribution of water and fat of each slice plane moves, the peak and root portions of the magnetization characteristic of the prepulse $P_{1331}$ satisfactorily matches the resonance curves $C_{WAT}$ and $C_{FAT}$ of water and fat in every slice plane.

As a result, the effect of suppressing MR signals from fat by a chemical selective suppression (CHESS) method is fully revealed at all times in every slice plane, and variations based on signals from fat of each slice plane are reduced considerably. Thus, the same advantage as that of the above-described second embodiment can be obtained.

Even when, in particular, the shift of the spectrum distribution of a certain slice plane is greater than the chemical shift of water and fat, the frequency correction of this embodiment works effectively. That is, when the magnetization characteristic of a prepulse $P_{1331}$ for suppressing MR signals from fat is fixed as in the prior art, the effect of suppression is effective in a certain slice plane, but the situation occurs in which the effect of suppression is decreased or there is almost no effect in another slice plane. However, according to this embodiment, it is possible to prevent such situation so that MR signals from fat can be suppressed considerably and uniformly in each slice plane.

The prepulse in the second and third embodiments, in addition to the 1331 binomial pulse, may be other binomial pulse such as 121 pulse or a pulse of a sinc function or a Gaussian function. The image data acquisition sequence which is performed subsequent to the application of a prepulse $P_{1331}$ is not limited to the above-described SE method (single spin echo method), and a sequence such as an FE method, or a fast SE method may also be used.

Although the second and third embodiments describe a construction in which the resonance curve of water is referenced as a reference peak on the spectrum distribution when the frequency offset $\Delta f$ is determined, a resonance curve of fat may be referenced as other examples of the reference peak. Since there are cases in which a volume site containing little water or fat is diagnosed, in such a case, the operator may use a reference reagent (e.g., TMS: tetramethylsilene) placed outside the diagnostic site and make a reference to the resonance curve of this reagent in order to determine the offset.

A fourth embodiment of the present invention will be explained with reference to FIGS. 20 to 22.

An MRI system according to the fourth embodiment is constructed to avoid use of a prepulse appeared in the previous first to third embodiments and to be able to perform a multi-slice imaging in which a repetition time TR is shorter and MR signals from fat are suppressed.

Figure 20:
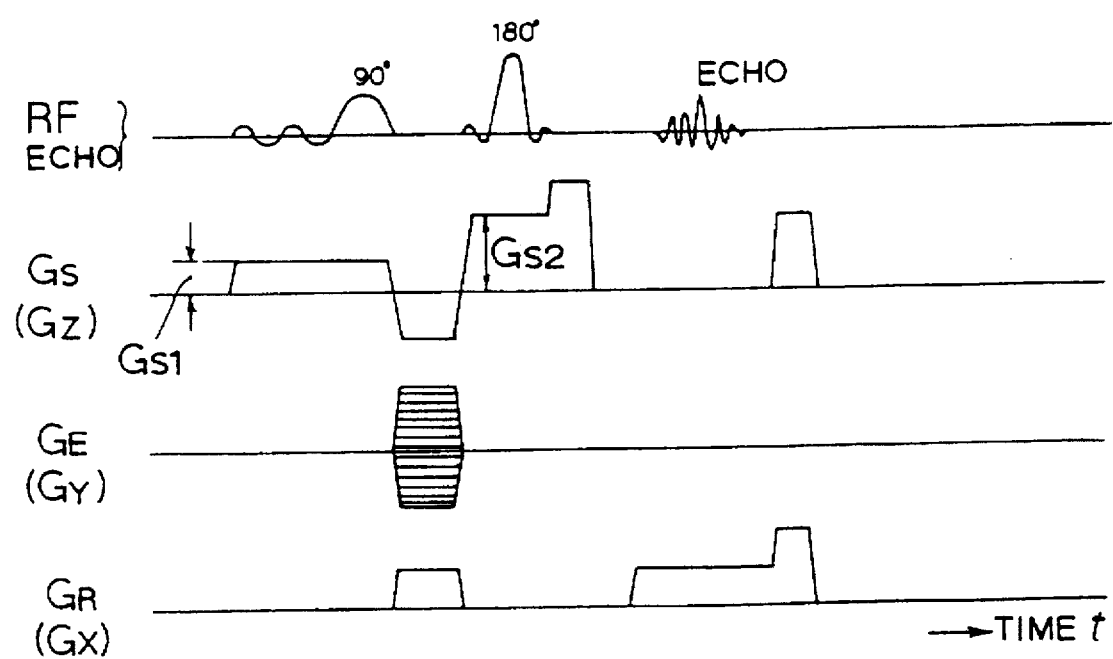
FIG. 20 is a pulse sequence showing for imaging according to a fourth embodiment of the present invention.

The MRI system of the present embodiment comprises the sequencer 5 that performs a multi-slice imaging in compliance with a pulse sequence shown in FIG. 20. The pulse sequence shown therein is base on a fast SE method and capable of selecting planes to be sliced within an object and, at the same time, selectively irradiating protons of only water in those sliced planes (i.e., most of the protons of fat not excited). Hereinafter, an imaging method using such a pulse sequence shown in FIG. 20 is to be referred to as an "Water-CHASE (Water Chemical Selective Excitation)" method.

In this Water-CHASE method, as shown in FIG. 16, a 90° RF pulse as an excitation pules is applied in parallel with applying a slicing magnetic field gradient $G_S = G_{S1}$ in the Z-axis direction. The 90° RF pulse consists of a sinc function whose $\pi$ numbers are "−4, +1" $\pi$ at its both sides, thus side lobes at one side (left side in FIG. 20) being designed to be longer and its total pulse length being approximately 20 msec. In this embodiment, in contrast, side lobes at the other side (right side in FIG. 20) are cut to shorten an echo time TE. The number of $\pi$ may be changed in a range of "−1, +1" $\pi$ to "−10, +10" $\pi$, if necessary.

Figure 21:
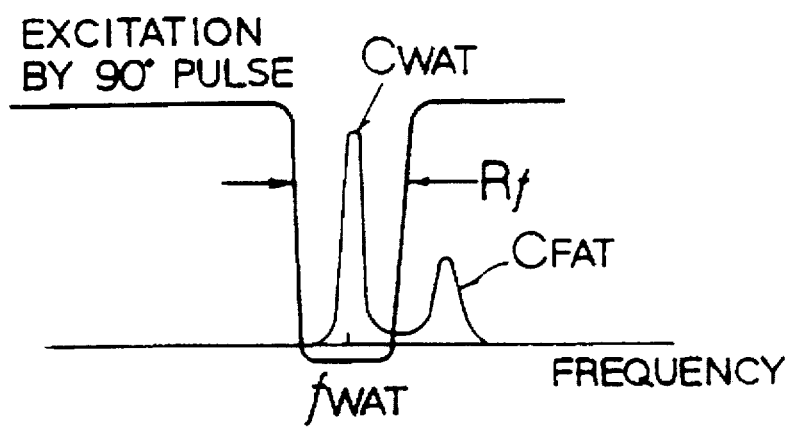
FIG. 21 represents an excitation state in which the resonance curve of only water is contained in the excitation range by a 90° RF pulse.
Figure 22:
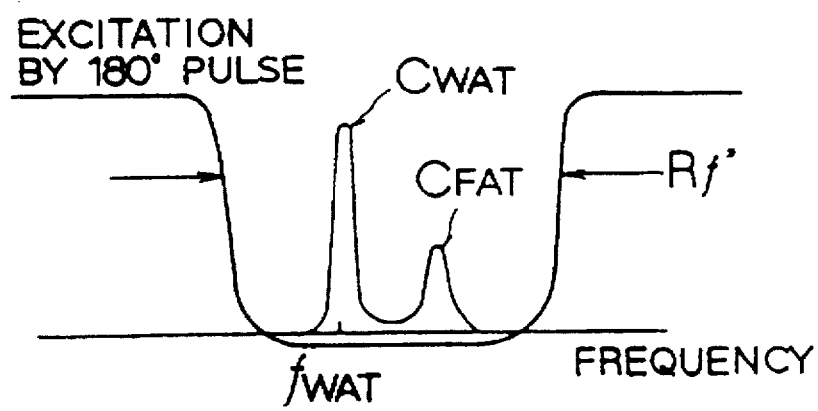
FIG. 22 represents a relation between the resonance curves of water and fat and the excitation range by a 180° RF pulse.

This longer 90° RF pulse in time than a conventional technique makes its excitation frequency range Rf shorter, as shown in FIG. 21. This excitation frequency range Rf contains only the resonance curve $C_{WAT}$ of water within each slicing plane and is adjusted to exclude the resonance curve $C_{FAT}$ of fat caused by the chemical shift phenomenon. During application of the longer 90° RF pulse, the strength of the slicing magnetic gradient $G_{S1}$ is set to be a desired value.

After this slicing, a phase-encoding magnetic gradient $G_E$ is applied together with a reading-out magnetic gradient $G_R$.

At a time since a period of TE/2 have passed from the application of the 90° RF pulse, a 180° RF pulse as a refocusing pulse (having shorter side lobes than the 90° RF pulse) will be applied under another slicing magnetic gradient $G_S = G_{S2}$ larger in strength than the previous one; namely, $G_{S2} > G_{S2}$. Such differences in the two slicing magnetic gradients $G_{S1}$ and $G_{S2}$ and in frequency ranges of the 90° and 180° RF pulses creates a situation such that a plane sliced at a time when the 180° RF pulse is applied differs in its sliced thickness by one slice from that at a time when the 90° RF pulse is applied.

Then, at a time when TE/2 has elapsed, an echo signal will be collected under application of another reading-out magnetic gradient $G_R$.

In the same way, another 180° RF pulse is repeatedly applied correspondingly to specified collection numbers of echo signals (at those time, the slicing magnetic gradient $G_S = G_{S2}$), and necessary echo data is collected according to the fast SE method.

In this Water-CHASE method, as understood from the above, a longer 90° RF pulse is applied together with a slicing magnetic gradient $G_S (= G_{S1})$, with the result that a desired slicing plane is magnetically selected and spins of protons contained in only water within the selected slicing plane are selectively excited in a manner shown in FIG. 21. The protons of water are always excited by the 90° RF pulse having a narrow frequency band—that is, on-resonance. After this excitation, a 180° RF pulse is applied together with different strength of a slicing magnetic gradient $G_S (= G_{S2})$, so that the excitation position of this time differs by about a slicing thickness compared with that by the 90° RF pulse. Thus, if a plane containing fat is selectively excited by the above 90° RF pulse, another plane will then be excited by the next 180° RF pulse, thereby an echo signal can not be acquired from the fat.

Therefore, the proton spins of water which had been forced to fall on the X-Y plane by the 90° RF pulse are then refocused by the 180° RF pulse, so that an echo signal is acquired by the refocusing. In contrast, as the proton spins of fat had not been excited by the 90° RF pulse, even when proton spins of both water and fat are excited together by a wider excitation frequency range Rf of the next 180° RF pulse as shown in FIG. 22, they are only compelled to fall in the minus Z-axis direction. Hence, an echo signal of proton spins in fat will not be acquired, thus being able to remarkably suppress echo signals from fat. And the multi-slice imaging is made possible and high-quality images can be obtained.

Furthermore, the selective excitation of proton spins of water at times of slicing eliminates the need for using prepulses, thereby making the repetition time TR shorter than a case where a prepulse is used. It is also possible to provide an echo signal collection that have higher resistance to ununiformity of the static magnetic field than that using binomial pulses. Further, since on-resonance is carried out, not off-resonance, to excite protons of water, the MTC effect is not occurred, thus avoiding a decrease in MR signal values from water and preserving a higher signal to noise ratio corresponding to a $T_1$-weighted image.

On one hand, there are J-couplings of spins of protons adjacent to each other among fat molecules, decreasing signals. In a fast SE method, J-modulation gives rise to a problem in which echo signals from fat is increased. In contrast, since almost all the fat protons are not excited in the above Water-CHASE method, there is nothing to do with the J-modulation. As a result, the Water-CHASE method is well applicable to the fast SE method.

As a pulse sequence applied to the Water-CHASE method, any SE method including a fast SE method can be used.

What we claim is:

1. A system for magnetic resonance imaging of an object placed in a static magnetic field, exposed to a pulse sequence for multi-slice imaging of each of a plurality of slicing planes of the object, the system comprising:

means for respectively detecting an amount of a frequency shift with respect to resonance of protons contained in each of the plurality of slicing planes, the amount of the frequency shift being measured on a reference frequency; and means for performing the pulse sequence, including means for respectively correcting the frequency shift in each of the plurality of slicing planes based on the amount detected by the detecting means.

2. The system according to claim 1, further comprising means for performing a shimming to increase uniformity of the static magnetic field prior to detection of the amount of the frequency shift in each of the plurality of slicing planes by the detecting means.

3. The system according to claim 2, wherein said shimming is a first-order volume shimming of an entire region over the plurality of slicing planes in the static magnetic field.

4. The system according to claim 2, wherein the pulse sequence includes a prepulse for suppressing a magnetic resonance signal from fat of the object and a series of signal-acquisition pulses, for application after the prepulse, including an RF excitation pulse for multi-slice imaging.

5. The system according to claim 4, wherein said correcting means includes means for correcting a central frequency of the prepulse applied to each of the plurality of slicing planes based on the amounts detected by the detecting means.

6. The system according to claim 4, wherein said correcting means includes means for correcting a central frequency of the RF pulse applied to each of the plurality of slicing planes based on the amounts detected by the detecting means.

7. The system according to claim 4, wherein said prepulse is one of a binomial pulse, a sinc function pulse, and a Gaussian function pulse.

8. The system according to claim 4, wherein said reference frequency is dependent on a frequency at a reference resonance peak on a frequency spectrum of a central slicing plane positioned at a center in a slicing direction perpendicularly oriented through the plurality of slicing planes.

9. The system according to claim 8, wherein said reference resonance peak is a resonance peak of either one of proton spins of water and fat at the central slicing planes.

10. The system according to claim 8, wherein said reference resonance peak is a resonance peak of a reference reagent placed outside the object.

11. The method of magnetic resonance imaging of an object in a static magnetic field exposed to a pulse sequence for multi-slice imaging directed to each of a plurality of a plurality of slicing planes of the object, the method comprising the steps of:

performing a first-order volume shimming of an entire region over the plurality of slicing planes in the static magnetic field; then detecting an amount of a frequency shift with respect to resonance of protons contained in each of the plurality of slicing planes, the amount of the frequency shift being measured on a reference frequency; then and performing the pulse sequence for each of the plurality of slicing planes, including correcting the frequency shift in each of the plurality of slicing planes on the basis of each of the amounts detected.

12. The method according to claim 11, wherein the pulse sequence has a prepulse for suppressing a magnetic resonance signal from fat of the object and a series of signal-acquisition pulses, applied after the prepulse, including an RF excitation pulse for multi-slice imaging.

13. The method according to claim 12, wherein said correcting step includes correcting a central frequency of the prepulse applied to each of the plurality of slicing planes on the basis of each of the amounts detected.

14. The method according to claim 12, wherein said correcting step includes correcting a central frequency of the RF pulse applied to each of the plurality of slicing planes on the basis of each of the amounts detected.

15. The method according to claim 12, wherein said reference is dependent on a frequency at a reference resonance peak on a frequency spectrum of a central slicing plane positioned at a center in a slicing direction perpendicularly oriented through the plurality of slicing planes.

16. The method according to claim 15, wherein said reference resonance peak is a resonance peak of either one of proton spins of water and fat at the central slicing plane.

* * * * *